United States Patent
Kang et al.

(10) Patent No.: US 10,084,020 B2
(45) Date of Patent: Sep. 25, 2018

(54) MICRO DISPLAY HAVING VERTICALLY STACKED STRUCTURE AND METHOD OF FORMING THE SAME

(71) Applicant: GWANGJU INSTITUTE OF SCIENCE AND TECHNOLOGY, Gwangju (KR)

(72) Inventors: Chang Mo Kang, Gwangju (KR); Dong Seon Lee, Gwangju (KR); Duk Jo Kong, Gwangju (KR); Soo Young Choi, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/826,069

(22) Filed: Nov. 29, 2017

(65) Prior Publication Data

US 2018/0151632 A1    May 31, 2018

(30) Foreign Application Priority Data

Nov. 29, 2016 (KR) .................. 10-2016-0160504

(51) Int. Cl.

| H01L 33/38 | (2010.01) |
|---|---|
| H01L 27/32 | (2006.01) |
| H01L 23/00 | (2006.01) |
| H01L 33/00 | (2010.01) |
| H01L 33/42 | (2010.01) |
| H01L 33/06 | (2010.01) |
| H01L 33/62 | (2010.01) |

(52) U.S. Cl.
CPC .......... *H01L 27/3211* (2013.01); *H01L 24/26* (2013.01); *H01L 27/3246* (2013.01); *H01L 33/0016* (2013.01); *H01L 33/06* (2013.01); *H01L 33/42* (2013.01); *H01L 33/62* (2013.01); *H01L 33/382* (2013.01); *H01L 33/387* (2013.01)

(58) Field of Classification Search
CPC ....... H01L 24/26; H01L 33/42; H01L 33/382; H01L 33/387

See application file for complete search history.

(56) References Cited

U.S. PATENT DOCUMENTS

| 8,794,501 | B2 | 8/2014 | Bibl et al. | |
|---|---|---|---|---|
| 2012/0061712 | A1* | 3/2012 | Masunaga | H01L 33/38 257/99 |
| 2012/0098023 | A1* | 4/2012 | Weng | H01L 33/20 257/99 |
| 2012/0248490 | A1* | 10/2012 | Weng | H01L 33/38 257/99 |
| 2013/0032776 | A1* | 2/2013 | Chen | H01L 33/145 257/9 |

\* cited by examiner

*Primary Examiner* — Dung Le
(74) *Attorney, Agent, or Firm* — Hauptman Ham, LLP

(57) ABSTRACT

Disclosed is a micro display. Each of display portions constituting the micro display includes an individual active layer and p-type semiconductor layer which are on each of a plurality of n-type semiconductors which are each configured in a line form. Consequently, a plurality of light emitting structures are formed on a common n-type semiconductor provided in a form of a single string, and a crossbar structure in which a positive electrode pattern perpendicular to a disposition direction of the common n-type semiconductor is disposed is formed. As a result, a micro display in which a plurality of light emitting structures can be individually controlled can be realized.

11 Claims, 4 Drawing Sheets the 2nd direction
the 1st direction

MICRO DISPLAY HAVING VERTICALLY STACKED STRUCTURE AND METHOD OF FORMING THE SAME

CLAIM FOR PRIORITY

This application claims priority to Korean Patent Application No. 10-2016-0160504 filed on Nov. 29, 2016 in the Korean Intellectual Property Office (KIPO), the entire contents of which are hereby incorporated by reference.

BACKGROUND

1. Technical Field

Example embodiments of the present invention relate in general to the field of a display device using a light emitting diode (LED) and more specifically to a display device in which LEDs capable of emitting red, green, and blue colors are vertically stacked, and capable of implementing a predetermined image through the vertically stacked LEDs.

2. Related Art

In order to create an image using light emitting diodes (LEDs), a process of individually separating the LEDs to form the individually separated LEDs into a single pixel is required. To this end, it is necessary to form LEDs on a growth substrate such as sapphire using an epitaxial process, and then to individually separate the LEDs from one another. Further, a process of transferring the separated LEDs to a predetermined substrate for a display is required.

U.S. Pat. No. 8,794,501 discloses a technique for transferring LEDs and disposing them on a substrate for a display. In this patent, transferring of LEDs formed on a growth substrate onto a transfer substrate and transferring of the LEDs disposed on the transfer substrate on the substrate for a display are disclosed.

First, the LEDs are formed on a growth substrate through epitaxial growth. Further, the individualized LEDs are transferred onto the transfer substrate. During the transferring, the growth substrate is removed through laser lift-off or the like.

The individualized LEDs disposed on the transfer substrate are picked up by a transferring head. Attraction is required for the transferring head to pick up the LEDs, and an electrostatic force is used as the attraction. The LEDs picked up by the transferring head through the electrostatic force are released on the substrate for a display.

In the above-described process, the LEDs disposed on the transfer substrate need to be individualized on a microscopic scale. Further, in order for the transferring head to pick up the individualized LEDs, a high voltage should be applied between the transferring head and each of the individualized LEDs. Furthermore, to maintain the electrostatic force between the transferring head and each of the individualized LEDs and prevent an electrostatic breakdown phenomenon, a dielectric film needs to be formed on a surface of the transferring head or each of the individualized LEDs.

When the dielectric film is formed on the transferring head in the above-described process, the dielectric film is damaged by repetitive transferring operations. Alternatively, when the dielectric film is formed on the surface of each of the individualized LEDs, a process of removing the dielectric film needs to be necessarily performed. Consequently, the technique for picking up and releasing the individualized LEDs using the electrostatic force is a considerable obstacle for commercialization.

In addition, there is a disadvantage in that a significant manufacturing time is required when a display is formed by separately transferring each of the individualized LEDs. To resolve such a problem, a technique for manufacturing an array type transferring head and transferring a plurality of LEDs in a single transferring operation has been proposed. However, when just a single LED is not picked up during the single transferring operation for the plurality of LEDs, or when a single LED is mispositioned during a releasing operation, the display becomes entirely defective. Further, since a single LED can form a single pixel in the display, a repair operation for removing a single mispositioned LED and replacing the single mispositioned LED with another LED becomes a problem to address.

Therefore, there is a need for an LED display wherein a separate transferring process for each of the LEDs configuring a pixel is unnecessary. Further, when the display is implemented in a form in which a growth substrate is not separated, processing costs and processing time can be reduced such that the display can be easily implemented.

SUMMARY

Accordingly, example embodiments of the present invention are provided to substantially obviate one or more problems due to limitations and disadvantages of the related art.

Example embodiments of the present invention provide a micro display capable of effectively reproducing an image by combining light emitting diodes (LEDs) capable of emitting light of different colors from one another.

In some example embodiments, a micro display includes a growth substrate; an n-type semiconductor layer formed on the growth substrate and configured with a plurality of n-type semiconductor strings extending in a first direction; a plurality of active layers formed on each of the plurality of n-type semiconductor strings; a p-type semiconductor layer formed on each of the plurality of active layers; a current diffusion layer formed on the p-type semiconductor layer; and a positive electrode electrically connected to the current diffusion layer and extending in a second direction perpendicular to the first direction.

In other example embodiments, a micro display includes a first display portion; a second display portion formed on the first display portion; and a third display portion formed on the second display portion, wherein a positive electrode and an n-type semiconductor layer of each of the first, second, and third display portions are provided in a form of a crossbar and are exposed to the outside.

In accordance with the present invention described above, a conventional LED manufacturing process is used without complicated processes of separating, picking up, and releasing LEDs, and a structure configured with an n-type semiconductor layer in a form of a string and a positive electrode perpendicular to an extending direction of the string is used. Through the described above, the LEDs formed on a single display portion can be individually controlled.

Further, a positive electrode and a negative electrode of each of display portions are formed as exposed structures. This allows various electrical connections between an external power source or a control terminal and a wire bonding or a ball grid array. Consequently, the display can be easily controlled through an external control terminal.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
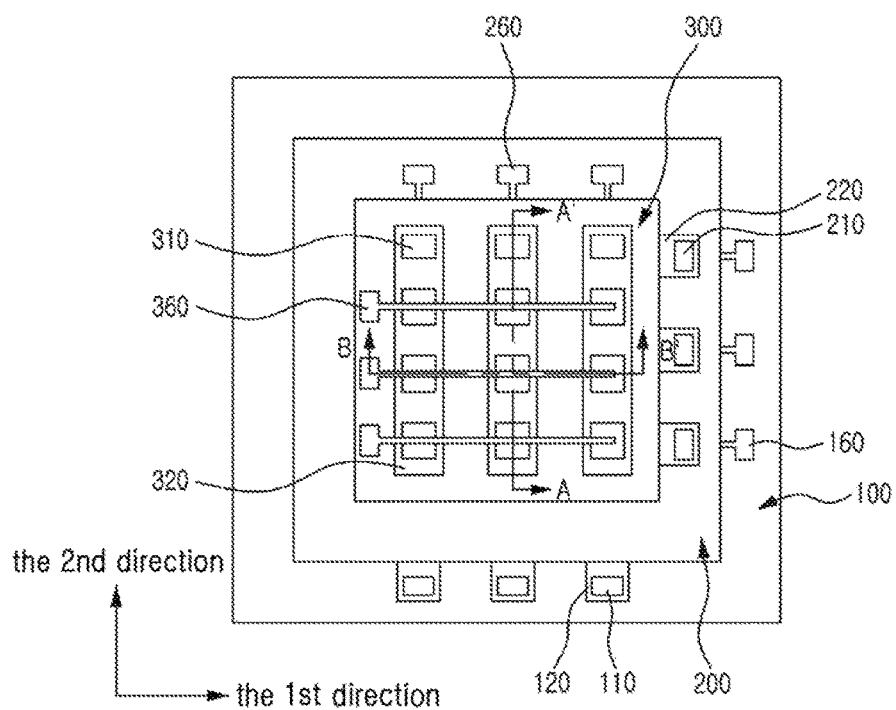
FIG. 1 is a top plan view illustrating a display using light emitting diodes (LED) according to a preferred embodiment of the present invention.

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Hereinafter, preferred embodiments of the present disclosure will be described in detail with reference to the accompanying drawings.

Embodiment

FIG. 1 is a top plan view illustrating a display using a light emitting diode (LED) according to a preferred embodiment of the present invention;

Referring to FIG. 1, the display using an LED includes a first display portion 100, a second display portion 200, and a third display portion 300.

The second display portion 200 is disposed on the first display portion 100, and the third display portion 300 is disposed on the second display portion 200. Preferably, the third display portion 300 forms blue light, the second display portion 200 forms green light, and the first display portion 100 forms red light.

Further, a structure in which light is emitted from the first display portion 100 toward the third display portion 300 is preferably formed. When blue light is emitted, the blue light is absorbed by the first display portion 100 and the second display portion 200 to form green light or red light such that color purity may be adversely affected. Consequently, a light emitting direction is preferably set in a direction in which wavelength decreases.

In addition, a single pixel may be defined in the display using an LED. In the display configured with a plurality of pixels, an area of the second display portion 200 is preferably set to be larger than that of the third display portion 300, and an area of the first display portion 100 is preferably set to be larger than that of the second display portion 200.

In each of the display portions 100, 200, and 300, electrodes are formed in a mutually intersecting structure. For example, in the third display portion 300, third positive electrodes 360 are formed to extend in a first direction, and third negative electrodes 310 are provided on a third n-type semiconductor layer 320 formed along a second direction that is disposed perpendicular to the first direction. Alternatively, according to embodiments, the third negative electrodes 310 may be formed to extend along the third n-type semiconductor layer 320.

Further, each of the display portions 100, 200, and 300 includes a plurality of n-type semiconductor layers extending perpendicular to a single positive electrode line. For example, the third display portion 300 includes the third n-type semiconductor layers 320 extending in the second direction. Also, it is preferable that a single third n-type semiconductor layer 320 is disposed parallel to an adjacent third n-type semiconductor layer 320 and that they are spaced apart from each other at regular intervals.

Further, a third active layer and a third p-type semiconductor layer may be provided on the third n-type semiconductor layer 320, which is provided in a form of a string, and a third current diffusion layer may be provided on the third p-type semiconductor layer. The third positive electrode 360 is formed on the third current diffusion layer, and is electrically connected to another current diffusion layer formed on an adjacent third n-type semiconductor layer in the form of a string.

In addition, the second display portion 200 is formed below the third display portion 300. The second display portion 200 is preferably configured to form green light, and includes a second n-type semiconductor layer 220 extending in the first direction and includes a second active layer and a second p-type semiconductor layer which are provided on the second n-type semiconductor layer 220 in a form of a string. Further, a second positive electrode 260 electrically connected to a second current diffusion layer formed on the second p-type semiconductor layer may extend in the second direction.

However, the directions in which the electrodes are formed between the display portions 100, 200, and 300 may be variously modified according to embodiment. For example, a first positive electrode 160 of the first display portion 100 and the second positive electrode 260 of the second display portion 200 may be formed to extend in the first direction the same as that of the third display portion 300, or may be formed to extend in a direction perpendicular to a positive electrode of an adjacent display portion.

In each of the display portions 100, 200, and 300 according to the present invention, the n-type semiconductor layers formed on the growth substrate are formed to extend along a specific direction in the form of a string. Further, the positive electrode formed on the p-type semiconductor layer commonly connects the p-type semiconductor layers which are adjacent in a direction perpendicular to the extension direction of the n-type semiconductor layer formed in the form of a string. Thus, the display portions 100, 200, and 300 may respectively apply an electric field to active layers in a form of a matrix.

Also, the first display portion 100 is formed below the second display portion 200, and, as in the display portions 200 and 300, the first positive electrode 160 is disposed perpendicular to a string-line of the first n-type semiconductor layer 120. Further, a first negative electrode 110 is disposed on the first n-type semiconductor layer 120.

Each of the electrodes is structurally formed to be exposed to the outside. To this end, the first negative electrode 110 and the first positive electrode 160 are exposed in a clearance space of the first display portion 100 in which the first display portion 100 and the second display portion 200 are bonded so as to be exposed. Further, a second negative electrode 210 and the second positive electrode 260 are exposed in a clearance space of the second display portion 200 in which the second display portion 200 and the third display portion 300 are bonded so as to be exposed. Furthermore, the third negative electrode 310 and the third positive electrode 360 are exposed at an edge region of the third display portion 300 formed on an uppermost layer.

Figure 2:
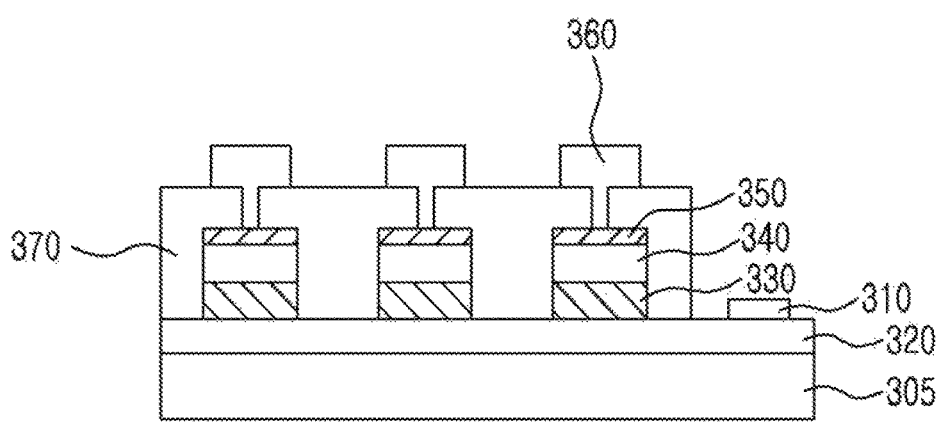
FIG. 2 is a cross-sectional view of a third display portion shown in FIG. 1 taken along a A-A' direction according to a preferred embodiment of the present invention.
Figure 3:
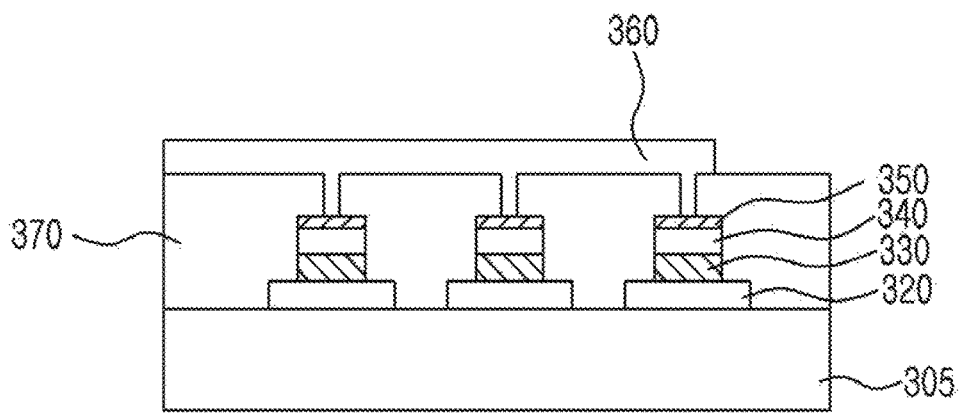
FIG. 3 is a cross-sectional view of the third display portion shown in FIG. 1 taken along a B-B' direction.

FIG. 2 is a cross-sectional view of the third display portion 300 shown in FIG. 1 taken along a A-A' direction according to a preferred embodiment of the present invention, and FIG. 3 is a cross-sectional view of the third display portion 300 shown in FIG. 1 taken along a B-B' direction.

Referring to FIGS. 2 and 3, the third n-type semiconductor layer 320 is formed on a third growth substrate 305. The third n-type semiconductor layer 320 is provided in a form extending in the second direction. Further, the third n-type semiconductor layer 320 is provided as a plurality of strings and the plurality of strings are preferably formed to be spaced apart from adjacent strings at regular intervals. Consequently, a plurality of third active layers 330 are provided on the third n-type semiconductor layer 320 constituting a single string. Further, a third p-type semiconductor layer 340 is provided on each of the plurality of third active layers 330, and a third current diffusion layer 350 is provided on the third p-type semiconductor layer 340. The third active layer 330 and the third p-type semiconductor layer 340 preferably have the same profile, and the third p-type semiconductor layer 340 and the third current diffusion layer 350 also preferably have the same profile. Consequently, the third active layer 330 and the third p-type semiconductor layer 340, each of which defines a pixel, may have the same area.

Further, the third negative electrode 310 is formed in an outer region of the third n-type semiconductor layer 320 constituting the string, and the third negative electrode 310 is provided to be exposed to the outside. That is, the third negative electrode 310 is formed on a surface of the third n-type semiconductor layer 320 except for on the surface thereof covered by a third passivation layer 370.

The third passivation layer 370 is formed on an entire surface of a structure formed up to the third current diffusion layer 350. That is, in FIG. 2, the third passivation layer 370 is formed to bury a gap between individual pixels configured with the third active layer 330, the third p-type semiconductor layer 340, and the third current diffusion layer 350, and, in FIG. 3, the third passivation layer 370 is formed to cover a portion of the third current diffusion layer 350 while burying a gap between strings configured with the third n-type semiconductor layer 320. However, the third positive electrode 360 is formed on each of the third current diffusion layers 350 so as to bury a via hole.

In FIGS. 2 and 3, the third display portion 300 emitting blue light is disclosed, but the first display portion 100 and the second display portion 200 may be formed in the same form described above. However, the positive electrode and the negative electrode intersect with each other in a vertical direction, and the form in which the display portions 100, 200, and 300 are bonded therebetween can be variously modified according to needs of those skilled in the art.

In FIGS. 2 and 3, the third growth substrate 305 is preferably sapphire. In order to emit blue light, a GaN-based compound single crystal is used. Accordingly, sapphire that is usable in the art may be used as the third growth substrate 305. Further, the third active layer 330 preferably has a multiple quantum well structure. Specifically, the third passivation layer 370 may be arbitrarily selected from among transparent materials having superior moisture resistance and flatness. For example, $SiO_2$ or the like may be used as the third passivation layer 370, and a transparent insulating polymer material may also be used as the third passivation layer 370. When the transparent insulating polymer material is used as the third passivation layer 370, dry etching may be employed to form a via hole used for forming the third positive electrode 360, and a patterning process using light absorption may be further employed, in addition to dry etching, to form the via hole.

Figure 4:
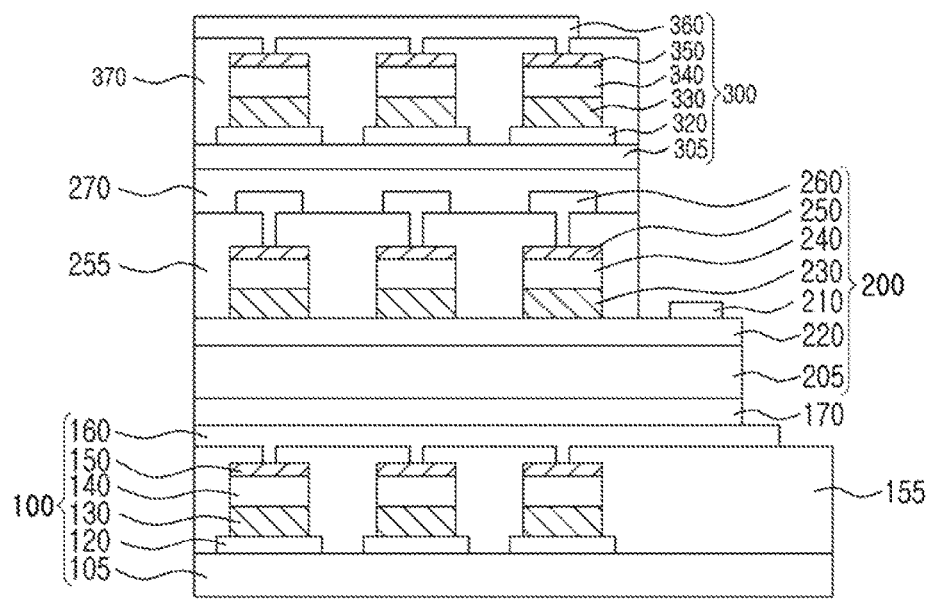
FIG. 4 is a partial cross-sectional view of the display of FIG. 1 taken along the A-A' direction according to the preferred embodiment of the present invention.

FIG. 4 is a partial cross-sectional view of the display of FIG. 1 taken along the A-A' direction according to the preferred embodiment of the present invention.

Referring to FIG. 4, the second display portion 200 is provided on the first display portion 100, and the third display portion 300 is formed on the second display portion 200.

A first inter-layer bonding layer 170 is provided between the first display portion 100 and the second display portion 200, and the first display portion 100 and the second display portion 200 are bonded. Further, a second inter-layer bonding layer 270 is provided between the second display portion 200 and the third display portion 300, and the second display portion 200 and the third display portion 300 are bonded. The first inter-layer bonding layer 170 and the second inter-layer bonding layer 270 may preferably be formed of the same material such as a transparent adhesive or a transparent pressure adhesive.

First, the first display portion 100 includes a first growth substrate 105, a first n-type semiconductor layer 120, a first active layer 130, a first p-type semiconductor layer 140, a first current diffusion layer 150, the first negative electrode 110, and the first positive electrode 160.

The first active layer 130 of the first display portion 100 emits red light. Accordingly, a AlInGaP-based multiple quantum well structure is required, and GaAs is preferably used as the first growth substrate 105. Materials of the growth substrate, the n-type semiconductor layer, the active layer, and the p-type semiconductor layer may be the same as a material used in a conventional technique of manufacturing a red LED.

However, the first n-type semiconductor layer 120 is provided in a form of a string, and a plurality of first active layers 130, a plurality of first p-type semiconductor layers 140, and a plurality of first current diffusion layers 150, which are individualized, are formed on the first n-type semiconductor layer 120. Also, the first positive electrode 160 is provided to electrically connect the plurality of first current diffusion layers 150 in a direction perpendicular to the extension direction of the first n-type semiconductor layer 120 provided in the form of a string. A first passivation layer 155 is provided between the first positive electrode 160 and each of the plurality of first current diffusion layers 150, and the first positive electrode 160 and the first n-type semiconductor layer 120 are provided in a crossbar form in which the first positive electrode 160 and the first n-type semiconductor layer 120 vertically intersect with each other, or in a form of a matrix.

The second display portion 200 is provided on the first display portion 100. The second display portion 200 includes a second growth substrate 205, the second n-type semiconductor layer 220, a second active layer 230, a second p-type semiconductor layer 240, a second current diffusion layer 250, the second negative electrode 210, and the second positive electrode 260.

When the second display portion 200 forms green light, the second growth substrate 205 may be formed of sapphire, and each of the second n-type semiconductor layer 220, the second active layer 230, and the second p-type semiconductor layer 240 may be preferably formed of a GaN-based compound semiconductor.

Similar to the first display portion 100 even in the second display portion 200, the second n-type semiconductor layer 220 is provided in a form of a string, and the second negative electrode 210 is formed at a specific portion of the string. Further, the second positive electrode 260 is formed in a direction vertically intersecting with the second n-type semiconductor layer 220.

Furthermore, the second active layer 230 and the second p-type semiconductor layer 240 of the second display portion 200 are preferably configured to match with the first active layer 130 and the first p-type semiconductor layer 140 of the first display portion 100, respectively. This means that, when the active layers 130, 230, and 330 of the display portions 100, 200, and 300 are viewed from above, the active layers 130, 230, and 330 are disposed to cross over each other. That is, when viewed above the display as shown in the top plan view of FIG. 1, the first active layer 130 and the second active layer 230 are preferably disposed at the same position. Through such a disposition, mixing of two or more colors is performed, and thus various colors can be realized according to the color mixture.

The third display portion 300 is provided on the second display portion 200. The third display portion 300 includes the third growth substrate 305, the third n-type semiconductor layer 320, the third active layer 330, the third p-type semiconductor layer 340, the third current diffusion layer 350, the third negative electrode 310, and the third positive electrode 360.

A configuration and an operation of the third display portion 300 are the same as those described in FIGS. 2 and 3.

Further, similar to the second display portion 200, in the third display portion 300, the third n-type semiconductor layer 320 is provided in a form of a string, and the third negative electrode 310 is formed at a specific portion of the string. Furthermore, the third positive electrode 360 is formed in a direction vertically intersecting with the third n-type semiconductor layer 320.

In addition, the third active layer 330 and the third p-type semiconductor layer 340 of the third display portion 300 are preferably configured to match with the second active layer 230 and the second p-type semiconductor layer 240 of the second display portion 200, respectively. Through such disposition, mixing of two or more colors is performed, and thus various colors can be realized according to the color mixture.

FIGS. 5, 6, 7, and 8 are perspective views for describing a method for manufacturing the display of FIG. 1 according to a preferred embodiment of the present invention.

Figure 5:
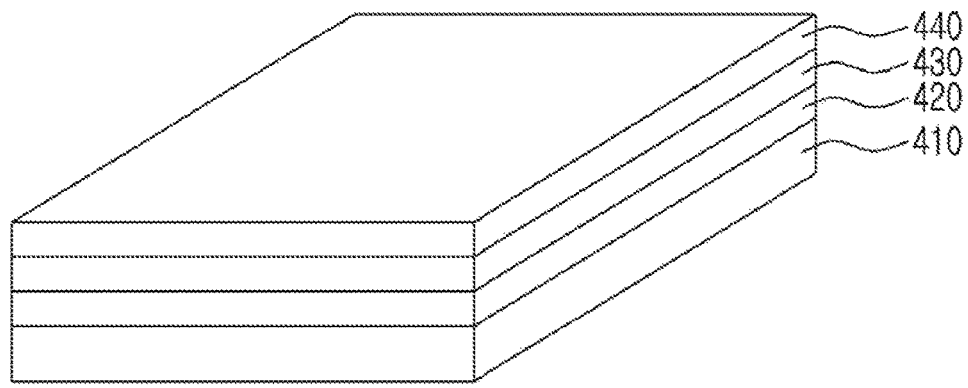
FIGS. 5, 6, 7, and 8 are perspective views for describing a method for manufacturing the display of FIG. 1 according to the preferred embodiment of the present invention.

Referring to FIG. 5, an n-type semiconductor layer 420, an active layer 430, and a p-type semiconductor layer 440 are provided on a growth substrate 410. Each of the semiconductor layers 420 and 440 may be made of a compound semiconductor on the basis of a crystal structure of the growth substrate 410, and a material of semiconductor layer may be determined according to a color of light to be emitted.

Figure 6:
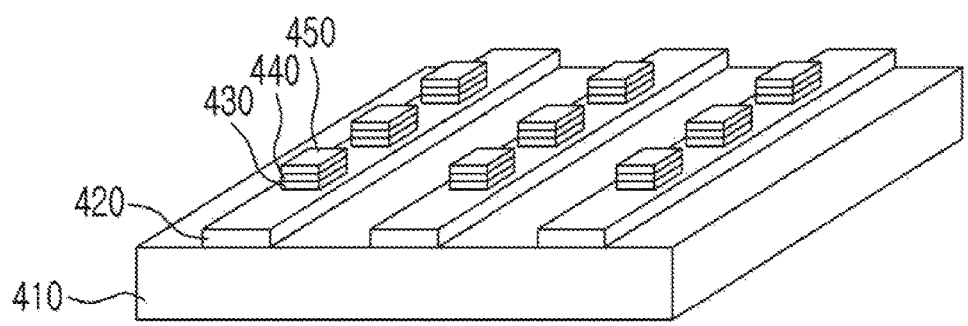

Referring to FIG. 6, strings of the n-type semiconductor layer 420 are formed by selectively etching the n-type semiconductor layer 420, the active layer 430, and the p-type semiconductor layer 440. Accordingly, the growth substrate 410 is exposed below a gap between the n-type semiconductor layers 420. Further, the active layer 430 and the p-type semiconductor layer 440 are also patterned through a separate etching process. That is, a plurality of active layers 430 and a plurality of p-type semiconductor layers 440 are provided on a single string of the n-type semiconductor layer 420. Furthermore, a current diffusion layer 450 is formed on each of the plurality of p-type semiconductor layers 440 through a separate deposition process. The current diffusion layer 450 may be made of a transparent conductive material such as indium tin oxide (ITO) or the like.

In FIG. 6, the plurality of active layers 430 are structurally formed to share the n-type semiconductor layer 420, which is in the form of a string.

Figure 7:
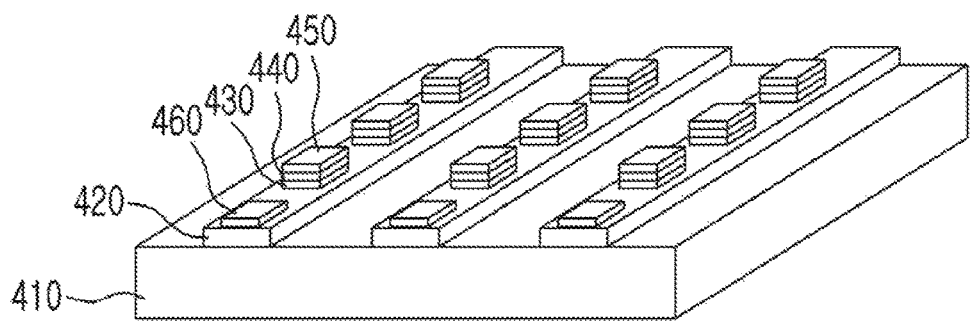

Referring to FIG. 7, a negative electrode 460 is formed at an end portion of the n-type semiconductor layer 420, which is in the form of a string. An ohmic contact material employed in a conventional LED manufacturing process may be used as a material of the negative electrode 460.

Figure 8:
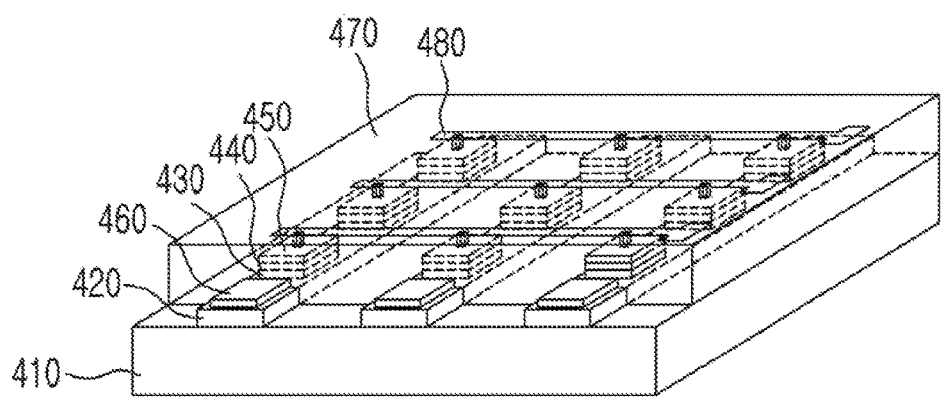

Referring to FIG. 8, a passivation layer 470 is formed on the structure of FIG. 7. The passivation layer 470 is formed of a transparent insulating material, and is formed to expose a portion of the n-type semiconductor layer 420 and the negative electrode 460 formed on the n-type semiconductor layer 420.

Further, a portion of an upper surface of the passivation layer 470 is removed and thus a via hole is formed at the removed portion, the via hole is buried, and then a positive electrode 480 is formed to be in contact with the current diffusion layer 450. The positive electrode 480 is configured to be electrically connected to an adjacent current diffusion layer 450.

That is, the positive electrode 480 is formed to extend in a direction perpendicular to the string of the n-type semiconductor layer 420 formed in one direction such that a crossbar structure is provided. Consequently, the active layers 430 may be individually selected to control a light emitting operation thereof.

Through the processes shown in FIGS. 5, 6, 7, and 8, each of the display portions 100, 200, and 300 is formed. The display portions 100, 200, and 300 are bonded by the inter-layer bonding layers 170 and 270. Therefore, a single pixel is implemented through a combination of the vertically stacked active layers.

In accordance with the present invention, a conventional LED manufacturing process is used without complicated processes of separating, picking up, and releasing LEDs, and the structure in which the n-type semiconductor layer in the form of a string and the positive electrode perpendicular to the extension direction of the string is used. Through the described above, the LEDs formed on a single display portion can be individually controlled.

Further, the positive electrode and the negative electrode of each of display portions are formed as exposed structures. This allows for various electrical connections to an external power source or a control terminal through a wire bonding or a ball grid array. Consequently, the display can be easily controlled through an external control terminal.

While the example embodiments of the present invention and their advantages have been described in detail, it should be understood that various changes, substitutions and alterations may be made herein without departing from the scope of the invention.

What is claimed is:

1. A micro display comprising:
   a growth substrate;
   an n-type semiconductor layer formed on the growth substrate and configured with a plurality of n-type semiconductor strings extending in a first direction;
   one or more active layers formed on each of the plurality of n-type semiconductor strings;
   a p-type semiconductor layer formed on each of the one or more active layers;
   a current diffusion layer formed on the p-type semiconductor layer; and
   a positive electrode electrically connected to the current diffusion layer and extending in a second direction perpendicular to the first direction; wherein a passivation layer is provided between the current diffusion layer and the positive electrode, and the current diffusion layer and the positive electrode are electrically connected by burying a via hole formed on the current diffusion layer.

2. The micro display of claim 1, wherein a plurality of active layers and a plurality of p-type semiconductor layers are provided on each of the plurality of n-type semiconductor strings, and the plurality of active layers and the plurality of p-type semiconductor layers share a single n-type semiconductor string.

3. The display of claim 1, further comprising:
   a negative electrode formed on the n-type semiconductor layer,
   wherein the negative electrode is formed at an edge region of the growth substrate.

4. The micro display of claim 3, wherein the passivation layer covers the n-type semiconductor layer, the active layer, and the p-type semiconductor layer, and exposes the negative electrode.

5. A micro display comprising:
   a first display portion;
   a second display portion formed on the first display portion; and
   a third display portion formed on the second display portion,
   wherein a positive electrode and an n-type semiconductor layer of each of the first, second, and third display portions are provided in a form of a crossbar, and end portions of the positive electrode and the n-type semiconductor layer are exposed to the outside; wherein the second display has an area that is larger than that of the third display portion, and the first display portion has an area that is larger than that of the second display portion.

6. The micro display of claim 5, wherein the first display portion, the second display portion, and the third display portion form different colors of light, respectively.

7. The micro display of claim 5, wherein the second display portion forms light having a wavelength that is shorter than that of the first display portion, and the third display portion forms light of a wavelength that is shorter than that of the second display portion.

8. The micro display of claim 5, wherein, in a state in which the first display portion and the second display portion are bonded, a first negative electrode and a first positive electrode of the first display portion are disposed in a clearance space of the first display portion.

9. The micro display of claim 5, wherein, in a state in which the second display portion and the third display portion are bonded, a second negative electrode and a second positive electrode of the second display portion are disposed in a clearance space of the second display portion.

10. The micro display of claim 5, wherein each of the first, second, and third display portions includes:
    a growth substrate;
    an n-type semiconductor layer formed on the growth substrate and configured with a plurality of n-type semiconductor strings extending in a first direction;
    one or more active layers formed on each of the plurality of n-type semiconductor strings;

a p-type semiconductor layer formed on each of the one or more active layers;

a current diffusion layer formed on the p-type semiconductor layer; and the positive electrode electrically connected to the current diffusion layer and extending in a second direction perpendicular to the first direction.

11. The micro display of claim 5, wherein a position of each of a first active layer configured to perform a light emitting operation of the first display portion, a second active layer configured to perform a light emitting operation of the second display portion, and a third active layer configured to perform a light emitting operation of the third display portion are mutually matched with each other so as to be disposed in a crossover form.

* * * * *